United States Patent [19]

Doy et al.

[11] Patent Number: 5,032,203
[45] Date of Patent: Jul. 16, 1991

[54] APPARATUS FOR POLISHING

[75] Inventors: Toshiroh K. Doy, Tokorozawa; Hiroshi Nakada, Tokyo; Yoshihiko Kunimitsu, Shinnanyo, all of Japan

[73] Assignees: Nippon Telegraph & Telephone Corp.; Nippon Silica Industrial Co., Ltd., both of Tokyo, Japan

[21] Appl. No.: 293,211

[22] Filed: Jan. 4, 1989

[30] Foreign Application Priority Data

Jan. 22, 1988 [JP] Japan .................................. 63-12995

[51] Int. Cl.$^5$ ............................................. B24B 29/00
[52] U.S. Cl. ..................................... 156/345; 156/636; 156/645; 156/903; 51/131.2; 51/131.3; 51/183 R
[58] Field of Search ............... 156/639, 636, 345, 903, 156/645; 252/79.5, 79.1; 51/131.2, 131.3, 183 R

[56] References Cited

U.S. PATENT DOCUMENTS

| 3,406,116 | 10/1968 | Vitale . | |
|---|---|---|---|
| 3,436,286 | 4/1969 | Lange | 156/635 |
| 3,979,239 | 9/1976 | Walsh . | |
| 4,057,939 | 11/1977 | Basi . | |
| 4,435,247 | 3/1984 | Basi et al. | 156/903 X |
| 4,792,416 | 12/1988 | Shimizu | 252/117 X |

FOREIGN PATENT DOCUMENTS 63-84872 4/1988 Japan .

Primary Examiner—David A. Simmons
Assistant Examiner—Thi Dang
Attorney, Agent, or Firm—McAulay Fisher Nissen Goldberg & Kiel

[57] ABSTRACT

Polishing agent including as a main constituent an aqueous solution containing sodium bromite. The aqueous solution may further contain particles which are not dissolved in the solution or an alkali agent to adjust the pH to 8 to 14. Also the apparatus and method for polishing articles using the polishing agent are disclosed.

1 Claim, 2 Drawing Sheets

APPARATUS FOR POLISHING

BACKGROUND OF THE INVENTION

1. Field of the Invention

The present invention relates to a polishing agent which is especially used for chemically or mechanochemically polishing surfaces of hard but fragile materials such as GaAs (gallium-arsenite), GaP (galliumphosphorus) and InP (indium-phosphorus) compound semiconductor crystals of III-V into a strain-free and mirror-like surface with a high efficiency, and an apparatus for polishing using the polishing agent.

2. Description of the Related Art

For polishing a compound semiconductor crystal base such as GaAs and InP, a mixture solution of etching $Br_2$ (bromine) and $CH_3OH$ (methanol) has conventionally been used as a polishing agent, to obtain a high polishing efficiency and to secure complete crystallinity of the processed surface.

When said polishing agent is used, various advantages are obtained such that several to ten-and-several times as high an efficiency could be obtained as that obtained by a mechanical polishing such as so-called pitch polishing hitherto employed and that almost no deteriorated layer is detected on the processed portion.

However, $Br_2$ (bromine) employed in the prior art polishing techniques, remarkably corrodes metals and produces unpleasant irritating smell. Therefore the polishing apparatus should be composed of limited kinds of materials and the poisonous nature of bromine requires special care and attention in handling. Thus, the polishing apparatus should be carefully equipped with devices for mixing liquids and treating waste liquids and exhaust gases.

Therefore, the polishing apparatus required various peripheral attachments and equipments and the high capital cost in the investment has been a fatal problem when a $Br_2$-$CH_3OH$ solution is employed as polishing agent.

Further, the compound semiconductors are now considered to take the place of Si (silicon) wafers for making LSI (large scale semiconductor integrated circuitry apparatus) in the future and will be necessarily produced in a comparable or rather larger amount than that of Si wafers. In addition, since the mixed solution of $Br_2$ and $CH_3OH$ is apt to decompose within several ten minutes after mixing, it is troublesome to use the mixed solution. Even if full measures are taken for safety, hygiene and also for the complete setting of apparatus, the most careful and incessant attention is still necessary, and therefore the mixed solution is not suited to use for the mass production.

SUMMARY OF THE INVENTION

A primary object of the present invention is to provide a solution to the above-mentioned problems.

An object of the present invention is to offer a polishing agent which is less hazardous to the human body.

Another object of this invention is to provide a process of polishing which is less hazardous to the human body.

The objects and features of the present invention will be evident in the following description and the accompanying drawings.

Features of the polishing agent described in this application are as follows:

(1) the most important feature is that an aqueous solution containing sodium bromite is taken as the main component of the polishing agent;
(2) the aqueous sodium bromite solution in (1) contains particles which do not dissolve in said aqueous solution;
(3) an alkali agent is added to the polishing agent in (1) or (2) to adjust the pH to a fixed value between pH 8 to 14;
(4) a surfactant is added to the polishing agent in (1), (2) or (3);
(5) an alkali phosphate such as sodium tripolyphosphate, sodium phosphate, sodium hexametaphosphate, and sodium pyrophosphate is added to the polishing agent in (1), (2), (3) or (4);
(6) a conditioning ring type polisher provided with a conditioning ring for polishing articles to be processed, comprising disposing a metal which decomposes sodium bromite on a part of the polishing plane of the conditioning ring;
(7) the whole conditioning ring in (6) is made of a metal which decomposes sodium bromite; and also
(8) the method of polishing articles to be processed, comprising adding fine particles of a metal which acts to decompose sodium bromite or an aqueous solution containing dispersed fine particles of said metal, the metal or the solution containing the metal being placed in a separate vessel other than the vessel which contains the polishing agent in (1) through (5), onto the polishing plane on the conditioning ring immediately before or after the polishing agent in an of (1) through (7) is applied in drops.

The polishing agent of this invention may be used in the same manner as the conventional polishing agents are used for the mechanochemical polishing of Si wafers for LSI manufacturing. But it is less hazardous and stable, permitting polishing of a high quality and a high efficiency. The polishing with an aqueous solution mainly composed of sodium bromite ($NaBrO_2$) may be applied to compound semiconductor crystals such as GaAs, GaP, InP, etc., and hard and fragile materials such as Si, sapphire, and glass.

The polishing agent of this invention is different from the conventional polishing mixed solution consisting of $Br_2$ and $CH_3OH$ which is toxic and very unstable. The present polishing agent can solve these problems and used in the commercial manufacturing level in the industry without causing any problem on management.

DETAILED DESCRIPTION OF THE INVENTION

The polishing agent of the present invention mainly comprising an aqueous solution of which the main component is sodium bromite ($NaBrO_2$) having a mild oxidizing property.

At first, as an example of manufacturing the polishing agent of this invention, crystalline powders containing more than 65% of $NaBrO_2$ (commercial $NaBrO_2 \cdot 3H_2O$, for example) are placed in pure water and the mixture is dissolved by stirring until no precipitate remains. The concentration of dissolved $NaBrO_2$ should be selected depending on the articles to be treated, but not more than 30% by weight, preferably 0.05 to 15% by weight and further preferably 0.1 to 10% by weight is desired.

The polishing agent of the present invention which is based on an aqueous solution of $NaBrO_2$, though it works well as it is, may be modified without departing from the scope of the present invention.

More particularly, fine particles (0.01 to 5 μm in diameter) of at least one compound which do not dissolve in the solution such as $SiO_2$, $Cr_2O_3$, $Al_2O_3$, $ZrO_2$, SiC, $CeO_2$, $Fe_2O_3$ and $CaCO_3$ may be mixed to the solution in an amount of not more than 10% in order to improve the mechanochemical effect of the $NaBrO_2$ solution. Further, surfactants and/or phosphates of an alkali metal may also be added to have further improved polishing results.

Since a $NaBrO_2$ solution is stabler when it is alkaline, an alkaline reagent may be added to a certain alkalinity (to pH 8 to 14, preferably 9.5 to 12) to improve the stability of the polishing agent as well as to improve the polishing efficiency.

The alkaline reagents include NaOH, KOH, $Na_2CO_3$, $NaHCO_3$, and organic alkaline reagents such as $OHCH_2CH_2N(CH_3)_3OH$(choline). At a pH not larger than 8, the $NaBrO_2$ does not exist in a stable form, and at a pH not lower than 14, a polished surface may probably be coarse.

The additives may be selected considering the physical properties of work pieces, such as hardness, toughness and tendency to be oxidized.

DETAILED DESCRIPTION OF THE PREFERRED EMBODIMENTS

In the following, the method of polishing using the polishing agent of this invention and an example of polishing apparatus will be illustrated.

EXAMPLE 1

A square base of GaAs single crystal of 0.5 mm thickness with 10 mm sides was attached on an attachment plate (60 mm φ, produced by SUS) with wax. A polisher (unwoven polyester cloth impregnated with polyurethane) was attached on the fixed bed (200 mm φ) of a polishing apparatus and said attachment plate was settled on said polisher. Polishing solutions used were prepared by dissolving odorless yellow crystalline powders of $NaBrO_2 \cdot 3H_2O$ having not less than 65% of $NaBrO_2$ content in various proportions in water. The pH of the solutions varied according to their concentrations and ranged from 10.8 to 13.5. The solutions were used for polishing and the GaAs bases were polished with a conditioning ring type polishing apparatus where the rotation speed and the pressure at the polishing were 60 rpm and 50 to 500 g/cm², respectively.

Figure 1:
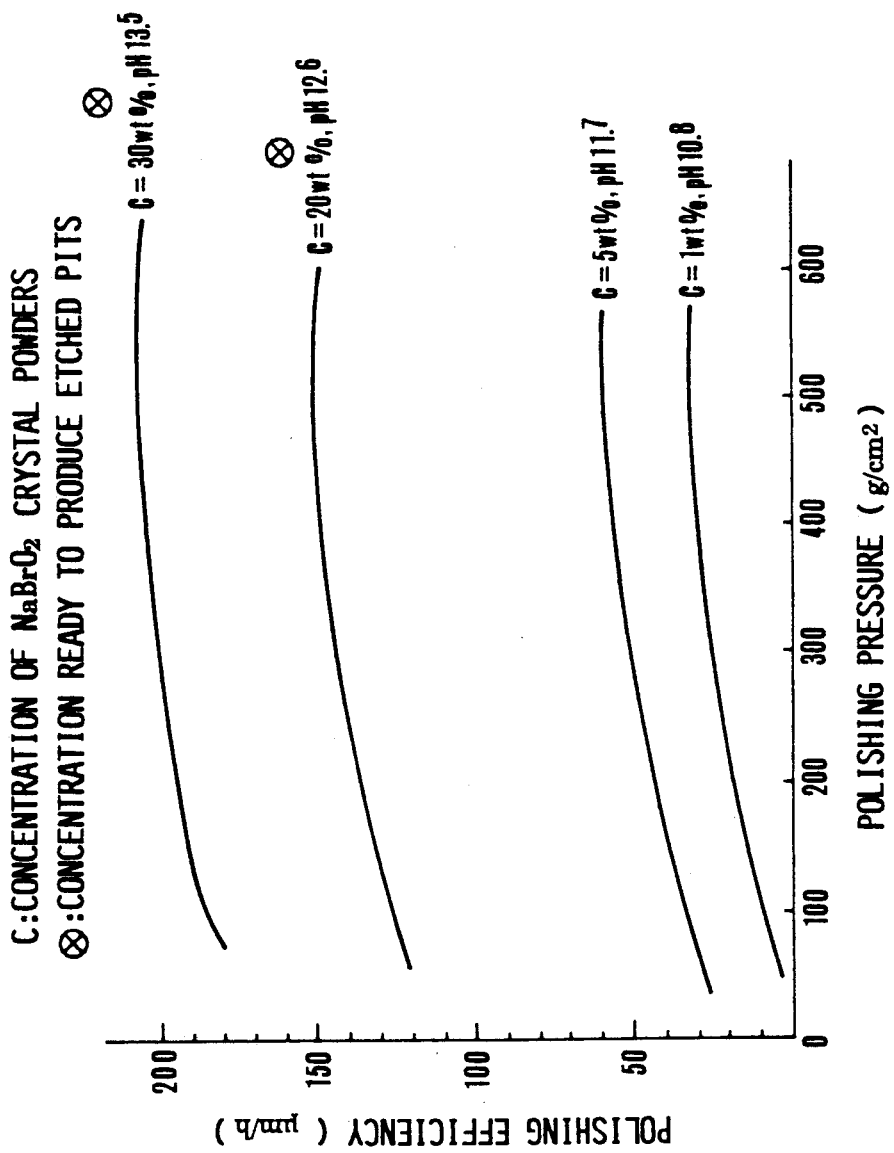
FIG. 1 is a characteristic curve showing an example of the relation between the polishing pressure and the polishing efficiency with the concentration C of $NaBrO_2$ as parameter.

FIG. 1 shows an example of the relation between the pressure at polishing and the polishing efficiency with the concentration C of the $NaBrO_2$ as a parameter. The polishing efficiency was found to have remarkably developed as compared with the prior art polishing method (the polishing efficiency corresponded to values obtained by the prior art polishing method when the concentration C of powdery crystals = 1% by weight).

If the concentration C of powdery crystals exceeds 20% by weight, occurrence of etch pits becomes remarkable. Therefore such higher concentrations are suited rather in the preliminary polishing step, where a high efficiency is aimed at, instead of in the finishing polishing step.

It was ascertained that the polished surface contained neither a scratch nor an etch pit when it was polished with a solution of the concentration C of powdery crystals lay between 0.05 to 20% by weight. However, washing with pure water is recommended immediately after the polishing process, because coating films or stains are likely to be formed.

EXAMPLE 2

To the polishing solution employed in Example 1 were added fine particles of $SiO_2$ (silicon dioxide) of various particle diameters. A small amount of NaOH (sodium hydroxide) was added to the mixture to raise the pH up to a constant value of 11.0–11.8. Comparison of the polishing efficiency conducted in the same manner as in Example 1 revealed a 1.2 to 2 times as much enhanced efficiency as that obtained without addition of fine particles of $SiO_2$. This was due to the activated mechanochemical effect induced by the mechanical action of fine $SiO_2$ particles.

It was noteworthy here that the polished surface evidenced higher quality. There was some likelihood in Example 1 that coating films were formed but in this example the formation of films could completely avoided. As combinedly shown in Table 1, the roughness of the polished surfaces is improved and reaches 80 to 20 Å $R_{max}$. The surface roughness depends not only on the polishing agent used but also on the polished material. Thus, when polishing was applied to a soft artificial leather, roughness of the surface of not larger than 10 Å $R_{max}$ could be realized. Finer particles of admixed $SiO_2$ were likely to produce surfaces of higher quality.

TABLE 1

| Polishing agent | Ratio of polishing efficiency | Surface roughness (Rmax) | Appearance of polished surface |
|---|---|---|---|
| NaBrO₂ (5 wt %) solution | 1 | | Good |
| NaBrO₂ (5 wt %) solution + 0.03 μm SiO₂ (2 wt %) | 1.5 Artificial leather (polisher) | 10–20 Å | Very good |
| | Woven tissue (double layer) | 20 Å | |
| | Polyurethane | 10–20 Å | |
| | 1.2 Unwoven tissue | 70 Å | |
| NaBrO₂ (5 wt %) solution + 0.24 μm SiO₂ (2 wt %) | 1.5 Artificial leather (polisher) | 20 Å | Very good |
| | Woven tissue (double layer) | 30–40 Å | |
| | Polyurethane | 20 Å | |

TABLE 1-continued

| Polishing agent | Ratio of polishing efficiency | Surface roughness (Rmax) | Appearance of polished surface |
|---|---|---|---|
| | 2.0 | Unwoven tissue | 70–80 Å |

EXAMPLE 3

An example was demonstrated in the preceding Example 2 where fine particles composed of $SiO_2$ were employed. Since any fine particles are useful so long as they can display the mechanochemical effect as described above, fine particles which do not dissolve in a solution containing 0.05 to 30% by weight of $NaBrO_2$ will manifest the effect of the present invention. Thus, fine particles of $Cr_2O_3$, $Al_2O_3$, $ZrO_2$, SiC, $CeO_2$, $Fe_2O_3$, $CaCO_3$, and diamond may be applied to develop the same effect as in Example 2.

EXAMPLE 4

The same procedure as in Example 1 was followed except that a polishing solution to which a surfactant (for example, an anionic surfactant) was added in an amount of 0.01 to 3.0% by volume was used. No coating film nor stain which was occasionally observed in Example 1 was formed. When said surfactant is added in a larger amount, the polishing efficiency is likely to be somewhat lowered, but a processed surface of higher quality can be obtained.

EXAMPLE 5

A surfactant was added to the polishing agents employed in Examples 2 and 3 in the same manner as in Example 4, then processed surfaces of higher quality could be obtained with high efficiency.

EXAMPLE 6

To the polishing agents employed in Examples 1 to 3, 0.5 to 2% of sodium pyrophosphate and sodium hexametaphosphate were added and the similar procedure was followed using these polishing solutions (agents). In any case, 1.5 to 2.5 times as much improved efficiency in polishing and higher quality of the processed surfaces could be obtained successfully. Other alkali metal phosphates such as sodium phosphate and sodium tripolyphosphate could give the similar effect.

EXAMPLE 7

In the preceding Examples 1 to 6, the decomposition and reaction of $NaBrO_2$ are intended to take place on the surface of sample to be polished. Actually $NaBrO_2$ in a solution is decomposed in the presence of metal such as iron, copper, chromium, nickel, and aluminum. For instance, the decomposition and reaction of $BrO_2$ in the presence of Cu ions proceed as follows:

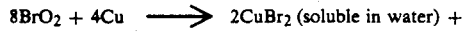

$$8BrO_2 + 4Cu \longrightarrow 2CuBr_2 \text{ (soluble in water)} + 2CuO \text{ (readily soluble in NaOH solution)} + 2Br_2 + 7O_2$$

The efficiency in polishing can be enhanced if the $Br_2$ generated here takes part in the reaction with the article to be processed immediately after being generated.

EXAMPLE 8

Figure 2:
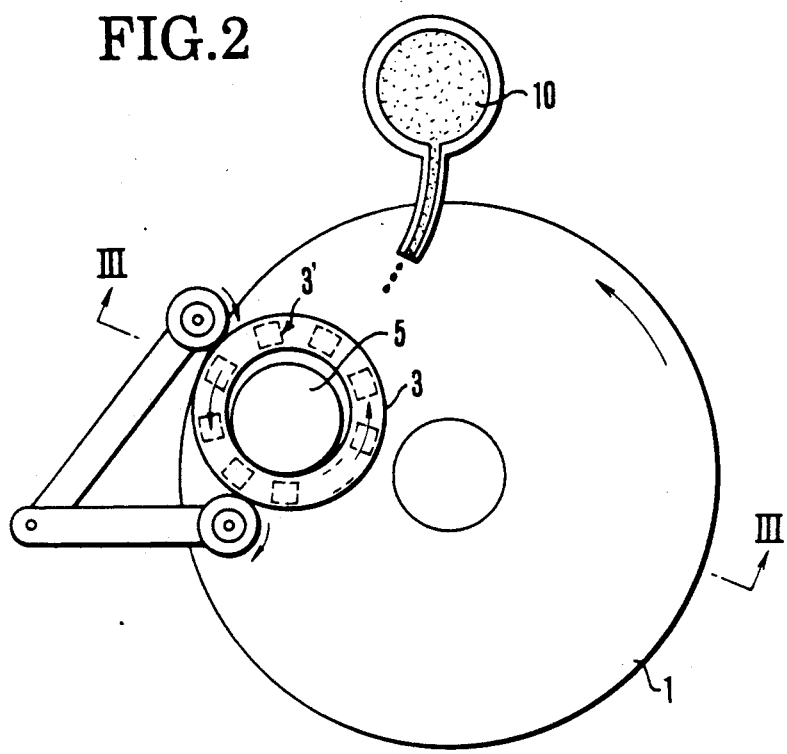
FIG. 2 is an explanatory figure for illustrating the outline of construction of the conditioning ring type polishing apparatus in Example 8.
Figure 3:
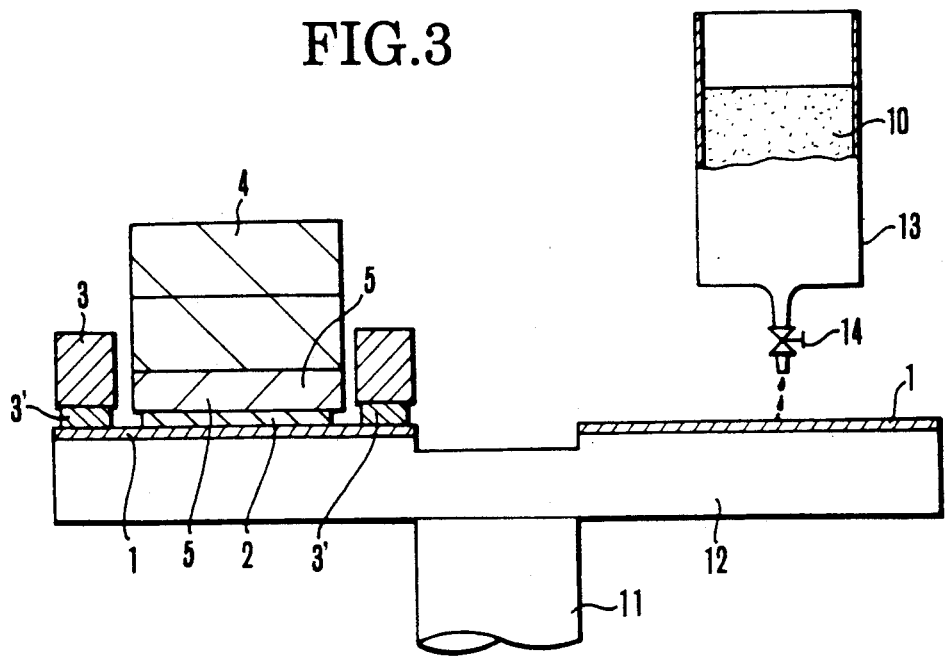
FIG. 3 is a cross-sectional view of the apparatus which is cut along the line III—III.

In the conditioning ring type polishing apparatus employed in this Example 8, a polisher 1 is set on a fixed bed 12 which is rotated together with a rotating shaft 11 by a rotation driving power source, as seen in FIGS. 2 and 3. On this polisher 1 is applied in drops the polishing agent 10 which was used in Examples 1 to 7. A sample 2 (GaAs crystals, for example) is bonded on the attachment plate 5 and this is disposed inside of the conditioning ring 3. Polishing is carried out with a load 4 placed on said attachment plate 5.

On the side of said conditioning ring 3 opposite to the polisher 1 are bonded small pieces 3' of a metal such as aluminum and iron at equal distances from each other. When polishing is carried out using the apparatus thus composed, the decomposition and reaction mentioned above take place immediately before polishing and therefore very effective action of $Br_2$ can be expected. In fact, the efficiency of polishing increased up to 1.2 to 1.5 times as much as it was in Examples 1 to 7. Of course, the conditioning ring 3 itself may be made of a metal and a part of the polisher may be replaced by a metal. The effect of adding of fine particles of metal becomes more remarkable if they are added immediately before or after the polishing agent 10 is added in drops. It is preferred to add the fine particles of metal in drops while they are being admixed with water. In FIG. 3, the notation 13 is a vessel for accommodating the polishing agent 10 and the notation 14 is a cock for adjusting the volume of the polishing agent in the form of a solution.

For stability of the polishing agents used in Examples 1 to 6, the relation was searched between the standing time in days of each polishing agent after the preparation (the agent being kept standing in a closed vessel except when used) and the efficiency of polishing. Result was that the effect of this invention little changed in 2 to 3 months. Thus, the agent seems to be almost free from decomposition even in a form of a solution. It is in contrast to conventional polishing agents such as the $Br_2$-$CH_3OH$ solution and the hypochlorite salt solutions which were likely to decompose in several minutes to several days. Predominance in stability was manifested.

In addition, the polishing agent of this invention hardly decomposes on irradiation by light and therefore is very easy in handling. The $NaBrO_2$ which is powdery solid is characteristically convenient to handle. Further, samples for polishing were taken in the form of a GaAs single crystal in the foregoing examples, but it was confirmed that the polishing may be conducted for single crystal of Si, sapphire and $LiTaO_3$ and other hard and fragile materials such as quartz glass, as well as for compound semiconductor crystals such as GaP and InP.

Thus, the present invention has been explained by referring to examples, but the invention, of course, is not limited to these examples and may be modified in various modes without departing from the scope of the invention.

For example, needless to say the present invention can be applied to polishing in general of Si, sapphire and $LiTaO_3$.

As has been explained above, an aqueous solution of which the base is prepared by dissolving crystalline powders containing $NaBrO_2$ in water is capable of etching those compound semiconductors such as GaAs, GaP and InP. The polishing agents prepared from said aqueous solution above by adding surfactant, fine particles which do not dissolve in said aqueous solution or phosphate of an alkali metal permit high quality surfaces (having strain-free and mirror-like surface) to be obtained with high efficiency. Furthermore, the solution has high stability and almost non-toxic to human body and can be used in the same manner as previous polishing agents. Thus, the polishing agents of the present invention can be used advantageously without any care in the manufacturing level in industry.

What is claimed is:

1. A polishing apparatus for polishing hard and fragile materials, comprising:
   a polisher having a polishing surface on which the material to be polished is placed,
   a conditioning rotatable ring slidably supported on the polishing surface and arranged to loosely hold the material to be polished,
   a metal piece disposed on said conditioning ring so as to contact a polishing surface,
   a vessel containing a polishing agent comprising an aqueous solution of sodium bromite, said vessel being arranged to drop the polishing agent onto the polishing surface and bring it into contact with the metal piece so as to decompose the sodium bromite and generate bromine.

* * * * *